(12) United States Patent
Yaoi et al.

(10) Patent No.: US 6,239,639 B1
(45) Date of Patent: May 29, 2001

(54) LATCH CIRCUIT

(75) Inventors: Yoshifumi Yaoi, Nara-ken; Yuichi Sato, Mie-ken, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/418,581

(22) Filed: Oct. 15, 1999

(30) Foreign Application Priority Data

Oct. 15, 1998 (JP) .................................................. 10-294310

(51) Int. Cl.⁷ .................................................. H03K 3/289
(52) U.S. Cl. ........................ 327/202; 327/203; 327/199
(58) Field of Search .................... 327/199–203, 327/208, 210–212, 534

(56) References Cited

U.S. PATENT DOCUMENTS

| | | | |
|---|---|---|---|
| 5,644,266 | * 7/1997 | Chen et al. | 327/534 |
| 5,821,769 | * 10/1998 | Douseki | 327/534 |
| 5,854,565 | * 12/1998 | Jha et al. | 327/202 |
| 5,982,211 | * 11/1999 | Ko | 327/202 |
| 6,002,284 | * 12/1999 | Hill et al. | 327/202 |

FOREIGN PATENT DOCUMENTS 10-294663   11/1998   (JP) .

OTHER PUBLICATIONS

Principles of CMOS VLSI Design "A Systems Perspective", Second Edition, Neil H. E. Weste et al., Addison Wesley 1992, pp. 325 and 331.

* cited by examiner

Primary Examiner—Terry D. Cunningham
Assistant Examiner—Long Nguyen

(57) ABSTRACT

A latch circuit includes a first circuit including an N-MOS transistor having a first electrode receiving a signal, a second electrode outputting the signal, a gate electrode, and a P-well, and a first inverter including input and output terminals. The second electrode of the N-MOS transistor is electrically connected to the input terminal of the first inverter, and the gate electrode of the N-MOS transistor is electrically connected to the P-well of the N-MOS transistor.

17 Claims, 7 Drawing Sheets

LATCH CIRCUIT

BACKGROUND OF THE INVENTION

1. Field of the Invention

The present invention relates to a D-type latch circuit and a D-type flip-flop circuit that are composed of MOS field effect transistors.

2. Description of the Related Art

FIG. 6 illustrates a configuration of a conventional dynamic D-type flip-flop circuit 30.

The dynamic D-type flip-flop circuit 30 includes a master latch 31 and a slave latch 32. The master latch 31 includes a transfer gate 23 and an inverter 24. The slave latch 32 includes a transfer gate 25 and an inverter 26.

FIG. 7 illustrates a configuration of the transfer gates 23 and 25 shown in FIG. 6. The transfer gate shown in FIG. 7 includes a p-channel MOS field effect transistor 27 (hereinafter referred to as P-MOS transistor) and an n-channel MOS field effect transistor 28 (hereinafter referred to as N-MOS transistor). The source and drain of the P-MOS transistor 27 are connected to the source and drain of the N-MOS transistor 28.

Referring to FIG. 7, when an input signal S is at a high level (hereinafter referred to as H level), an inverse input signal −S of the input signal S is at a low level (hereinafter referred to as L level). In this case, the P-MOS transistor 27 and the N-MOS transistor 28 are in the open state, and thus a signal A input to the transfer gate is output as a signal Y from the transfer gate.

When the input signal S is at the L level, the inverse input signal −S is at the high level. In this case, the P-MOS transistor 27 and the N-MOS transistor 28 are in the closed state, and thus the signal A input to the transfer gate is not output from the transfer gate.

FIG. 8 illustrates a configuration of an inverter. The inverter shown in FIG. 8 includes a P-MOS transistor 29 and an N-MOS transistor 30. The gate of the P-MOS transistor 29 is connected to the gate of the N-MOS transistor 30. The source of the P-MOS transistor 29 is connected to a power source $V_{DD}$. The source of the N-MOS transistor 30 is connected to a ground GND. The drain of the P-MOS transistor 29 is connected to the drain of the N-MOS transistor 30.

The dynamic D-type flip-flop circuit 30 shown in FIG. 6 receives clock signals BCK and −BCK. FIG. 9 illustrates a clock generating circuit for generating the clock signals BCK and −BCK. The clock generating circuit shown in FIG. 9 includes inverters 51 and 52. The clock generating circuit shown in FIG. 9 generates the clock signals BCK and −BCK from a clock signal CK.

FIG. 10 illustrates a configuration of a conventional static D-type flip-flop circuit 60. The static D-type flip-flop circuit 60 includes a master latch 61 and a slave latch 62. The master latch 61 includes transfer gates 35 and 38, and inverters 36 and 37. The slave latch 62 includes transfer gates 39 and 42, and Inverters 40 and 41. The transfer gates 35, 38, 39, and 42 have the same configuration as that shown in FIG. 7.

The conventional static D-type flip-flop circuit 60 is the same operation as that of the dynamic D-type flip-flop circuit 30 shown in FIG. 6. However, for example, when the transfer gate 35 of the static D-type flip-flop circuit 60 is in the closed state, the transfer gate 38 is in the open state while holding a signal, which has been input to the transfer gate 35 in the immediately previous open state, in a circuit of the transfer gate 38 and the inverters 36 and 37. Therefore, even when the transfer gate 35 is in the closed state, the signal which has been input to the transfer gate 35 in the immediately previous open state is output from the master latch 61. The same applies to the slave latch 62.

The conventional flip-flop circuits 30 and 60 require the clock signals BCK and −BCK having reversed polarities. In order to obtain the clock signals BCK and −BCK using the clock signal CK, the clock generating circuit shown in FIG. 9, i.e., the inverter, is necessary.

SUMMARY OF THE INVENTION

According to one aspect of this invention, a latch circuit includes a first circuit including an N-MOS transistor having a first electrode receiving a signal, a second electrode outputting the signal, a gate electrode, and a P-well, and a first inverter including input and output terminals. The second electrode of the N-MOS transistor is electrically connected to the input terminal of the first inverter, and the gate electrode of the N-MOS transistor is electrically connected to the P-well of the N-MOS transistor.

According to another aspect of this invention, a latch circuit includes a P-MOS transistor having a first electrode receiving a signal, a second electrode outputting the signal, a gate electrode, and an N-well, and a first inverter including input and output terminals. The second electrode of the P-MOS transistor is electrically connected to the input terminal of the first inverter, and the gate electrode of the P-MOS transistor is electrically connected to the N-well of the P-MOS transistor.

In one embodiment of the present invention, a latch circuit further includes a second circuit including a P-MOS transistor having a first electrode receiving a signal, a second electrode outputting the signal, a gate electrode, and an N-well, and a second inverter including input and output terminals. The second electrode of the P-MOS transistor is electrically connected to the input terminal of the second inverter, and the gate electrode of the P-MOS transistor is electrically connected to the N-well of the P-MOS transistor.

In one embodiment of the present invention, the first circuit serves as a master latch and the second circuit serves as a slave latch, a clock signal having a first or second level is input to the first and second circuits, the first circuit is in the open state when receiving the clock signal having the first level, the first circuit is in the closed state when receiving the clock signal having the second level, the second circuit is in the closed state when receiving the clock signal having the first level, and the second circuit is in the open state when receiving the clock signal having the second level.

In one embodiment of the present invention, the first circuit serves as a slave latch and the second circuit serves as a master latch, a clock signal having a first or second level is input to the first and second circuits, the first circuit is in the open state when receiving the clock signal having the first level, the first circuit is in the closed state when receiving the clock signal having the second level, the second circuit is in the closed state when receiving the clock signal having the first level, and the second circuit is in the open state when receiving the clock signal having the second level.

In one embodiment of the present invention, the first inverter includes an N-MOS transistor having a P-well and a gate electrode, and a P-MOS transistor having an N-well and a gate electrode.

In one embodiment of the present invention, the second inverter includes an N-MOS transistor having a P-well and a gate electrode, and a P-MOS transistor having an N-well and a gate electrode.

In one embodiment of the present invention, the absolute value of a threshold voltage of the N-MOS transistor included in the first circuit is smaller than the absolute value of a threshold voltage of the P-MOS transistor included in the first inverter.

In one embodiment of the present invention, the absolute value of a threshold voltage of the P-MOS transistor included in the second circuit is smaller than the absolute value of a threshold voltage of the N-MOS transistor included in the second inverter.

In one embodiment of the present invention, the first inverter includes an N-MOS transistor having a P-well and a gate electrode, and a P-MOS transistor having an N-well and a gate electrode, the second inverter includes an N-MOS transistor having a P-well and a gate electrode, and a P-MOS transistor having an N-well and a gate electrode, and the P-wells of the N-MOS transistors included in the first and second inverters are electrically connected to the gate electrodes of the N-MOS transistor included in the first and second inverters, respectively, and the N-wells of the P-MOS transistors included in the first and second inverters are electrically connected to the gate electrodes of the P-MOS transistor included in the first and second inverters, respectively.

In one embodiment of the present invention, the clock signal has one phase and one polarity.

Hereinafter, functions of the present invention will be described.

In the latch circuit according to the present invention, the gate electrode and P-well of the N-MOS transistor are electrically connected to each other. When such an N-MOS transistor is in the closed state, it has the same threshold voltage as that of a general N-MOS transistor. When the N-MOS transistor is in the open state, it has a smaller threshold voltage than that of the general N-MOS transistor. Therefore, the absolute value of the threshold voltage of the N-MOS transistor serving as a transfer gate in the open state is smaller than the absolute value of the threshold voltage of the P-MOS transistor included in the inverter positioned in a stage following the transfer gate. Therefore, the voltage of an output signal having the H level from the N-MOS transistor operating as the transfer gate is sufficiently prevented from decreasing.

As a result, a current passing across the inverter connected to a stage following the N-MOS transistor is substantially suppressed. In the latch circuit according to the present invention, power consumption can be largely reduced.

In another latch circuit according to the present invention, the gate electrode and N-well of the P-MOS transistor are electrically connected to each other. When such a P-MOS transistor is in the closed state, it has the same threshold voltage as that of a general P-MOS transistor. When the P-MOS transistor wherein the gate electrode and N-well thereof are connected to each other is in the open state, it has a smaller threshold voltage than that of the general P-MOS transistor. Therefore, the absolute value of the threshold voltage of the P-MOS transistor serving as a transfer gate in the open state is smaller than the absolute value of the threshold voltage of the N-MOS transistor included in the inverter positioned in a stage following the transfer gate. Therefore, the voltage of an output signal having the L level from the P-MOS transistor operating as a transfer gate is sufficiently prevented from increasing. As a result, power consumption caused by a current passing across the inverter is largely reduced. Moreover, when the P-MOS transistor is in the closed state, there is substantially no leak current therein.

Thus, the invention described herein makes possible the advantages of providing a latch circuit and a flip-flop circuit which include a small number of elements and require low power consumption.

These and other advantages of the present invention will become apparent to those skilled in the art upon reading and understanding the following detailed description with reference to the accompanying figures.

DESCRIPTION OF THE PREFERRED EMBODIMENTS

EXAMPLE 1

A dynamic D-type flip-flop circuit according to Example 1 of the present invention will be described below with reference to FIGS. 1, 2A, 2B, 3A, 3B, 4A, and 4B.

Figure 1:
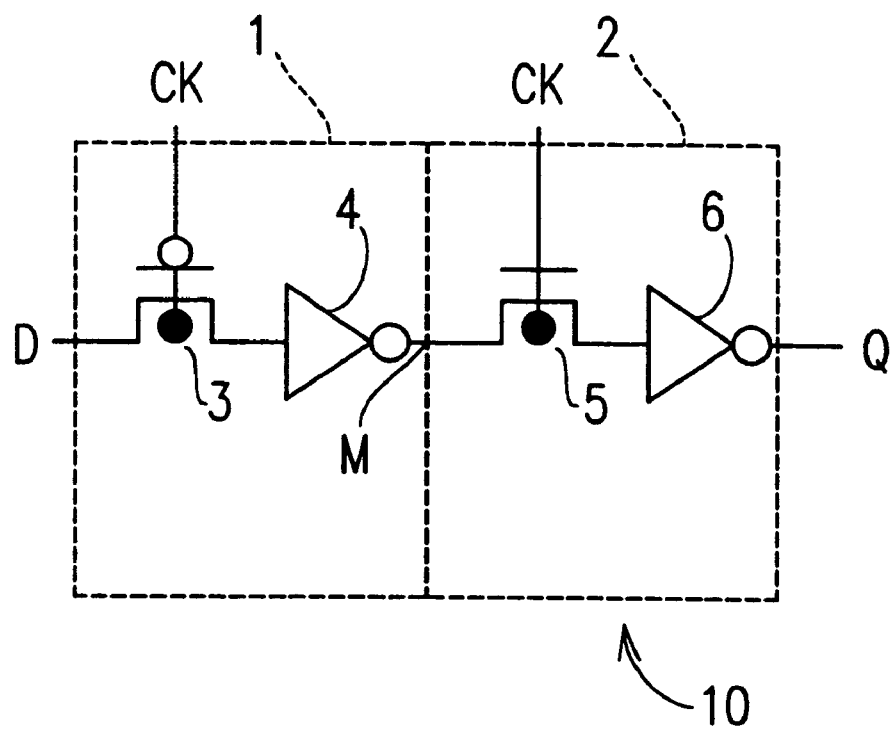
FIG. 1 is a diagram illustrating a dynamic flip-flop circuit according to Example 1 of the present invention.

FIG. 1 illustrates the dynamic flip-flop circuit of Example 1.

The dynamic flip-flop circuit 10 includes a master latch 1 and a slave latch 2. The master latch 1 includes a transfer gate which is a P-type dynamic threshold (DT) MOS transistor 3 (hereinafter referred to as P-DTMOS transistor), and an inverter 4. The slave latch 2 includes a transfer gate which is an N-type DTMOS transistor 5 (hereinafter referred to as N-DTMOS transistor), and an inverter 6.

The P-type DTMOS transistor 3 and the N-type DTMOS transistor 5 will be described with reference to FIGS. 2A through 3B.

Figure 2A:
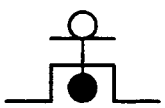
FIG. 2 is a diagram illustrating a symbol representing a P-DTMOS transistor shown in FIG. 1.
FIG. 2B is a diagram illustrating a configuration of the P-TMOS transistor shown in FIG. 1.
Figure 2B:
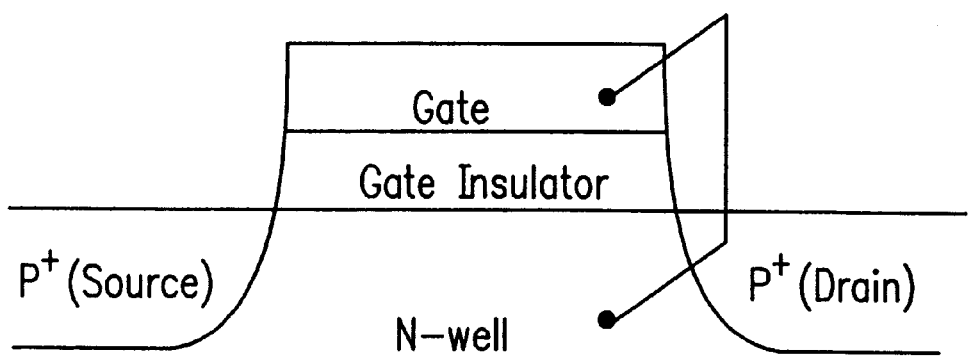

FIG. 2A illustrates a symbol representing the P-DTMOS transistor 3. FIG. 2B illustrates a configuration of the P-DTMOS transistor 3. The P-DTMOS transistor includes a source, a drain, a gate, and a gate insulator. The source is of P+ type. The drain is of P+ type. An active region is of N-well type. In the P-DTMOS transistor, the N-well is electrically connected to the gate.

Figure 3A:
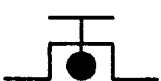
FIG. 3A is a diagram illustrating a symbol representing an N-DTMOS transistor shown in FIG. 1.
Figure 3B:
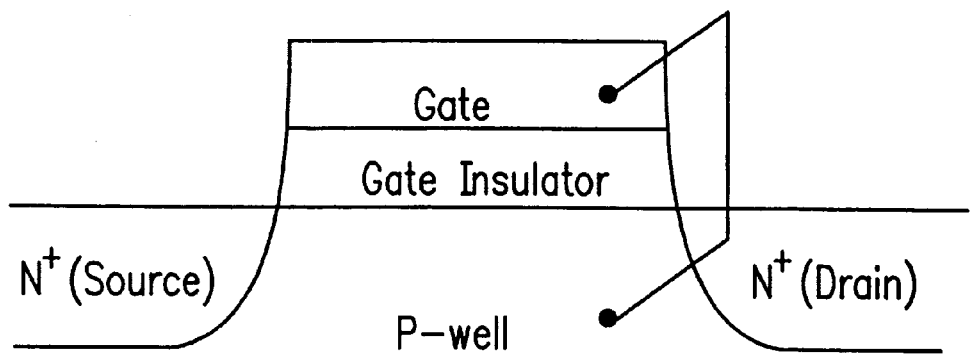
FIG. 3B is a diagram illustrating a configuration of the N-DTMOS transistor shown in FIG. 1.

FIG. 3A illustrates a symbol representing the N-DTMOS transistor 5. FIG. 3B illustrates a configuration of the N-DTMOS transistor 5. The N-DTMOS transistor includes a source, a drain, a gate, and a gate insulator. The source is of N+ type. The drain is of N+ type. An active region is of P-well type. In the N-DTMOS transistor, the P-well is electrically connected to the gate. As described above, the DTMOS transistor is such that the well including the active region is electrically connected to the gate.

Referring to FIG. 1, the P-DTMOS transistor 3 receives a clock signal CK at the gate thereof. The P-DTMOS transistor 3 also receives an input data signal D, and outputs the data signal to the inverter 4 in accordance with the clock signal CK. The inverter 4 inverts the received signal and outputs an inverse signal M.

The N-DTMOS transistor 5 receives a clock signal CK at the gate thereof. The N-DTMOS transistor 5 also receives the signal M, and outputs the signal M to the inverter 6 in accordance with the clock signal CK. The inverter 6 inverts the received signal and outputs an inverse signal Q.

Figure 4A:
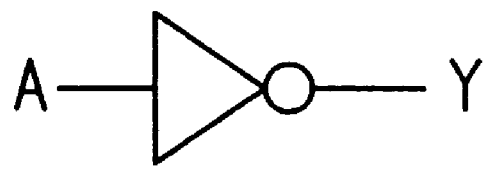
FIG. 4A is a diagram illustrating a symbol representing inverters shown in FIG. 1.
Figure 4B:
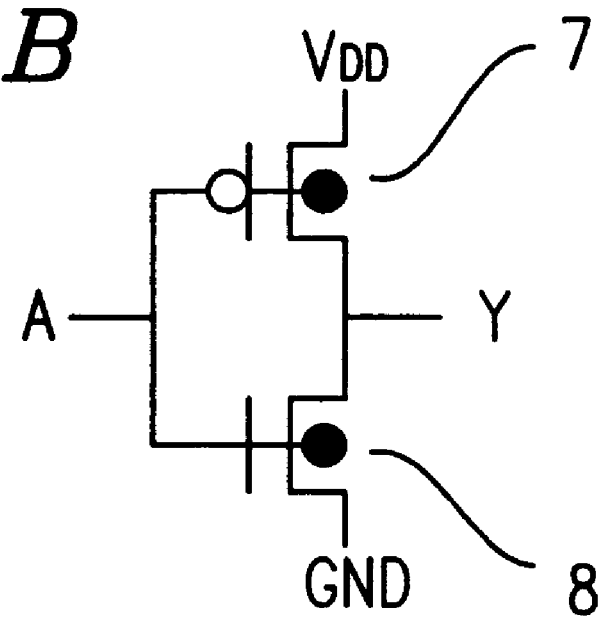
FIG. 4B is a diagram illustrating a configuration of the inverters shown in FIG. 1.

In Example 1, the inverters 4 and 6 maybe composed of DTMOS transistors. FIG. 4A illustrates a symbol representing the inverters 4 and 6. FIG. 4B illustrates a specific configuration of the inverters 4 and 6. The inverters 4 and 6 each include a P-DTMOS transistor 7 and an N-DTMOS transistor 8.

A threshold voltage $V_{thpoff}$ is defined as a threshold voltage of the P-MOS transistor when the N-well of the P-MOS transistor is connected to a power source. A threshold voltage $V_{thpon}$ is defined as a threshold voltage of the P-MOS transistor when the N-well of the P-MOS transistor is connected to a ground. A threshold voltage $V_{thnoff}$ is defined as a threshold voltage of the N-MOS transistor when the P-well of the N-MOS transistor is connected to a ground. A threshold voltage $V_{thnon}$ is defined as a threshold voltage of the N-MOS transistor when the P-well of the N-MOS transistor is connected to a power source.

As described above, the master latch 1 includes the P-DTMOS transistor 3, and the inverter 4 includes the P-DTMOS transistor and the N-DTMOS transistor. A relationship between the threshold voltage $V_{thpon}$ of the P-DTMOS transistor 3 in the open state and the threshold voltage $V_{thnoff}$ of the N-DTMOS transistor in the closed state, of the inverter 4 is as follows.

$|V_{thpon}$ (the threshold voltage of the P-DTMOS transistor 3) $|<|V_{thnoff}$ (the threshold voltage of the N-DTMOS transistor of the inverter 4)$|$ Accordingly, when the inverter 4 receives a data signal D having the L level which is the absolute value $|V_{thpon}|$ of the threshold voltage of the P-DTMOS transistor 3 higher than a ground voltage, there is not a current passing across the N-DTMOS transistor of the inverter 4 in the master latch 1.

The slave latch 2 includes the N-DTMOS transistor 5, and the inverter 6 includes the P-DTMOS transistor and the N-DTMOS transistor. A relationship between the threshold voltage $V_{thnon}$ of the N-DTMOS transistor 5 in the open state and the threshold voltage $V_{thpoff}$ of the P-DTMOS transistor in the closed state, of the inverter 6 is as follows.

$|V_{thnon}$ (the threshold voltage of the N-DTMOS transistor 5) $|<|V_{thpoff}$ (the threshold voltage of the P-DTMOS transistor of the inverter 6)$|$ Accordingly, when the inverter 6 receives the input data signal M having the H level which is the absolute value $|V_{thnon}|$ of the threshold voltage of the N-DTMOS transistor 5 lower than a power source voltage, there is not a current passing across the P-DTMOS transistor of the inverter 6 included in the latch 2.

Consequently, power consumption by the inverters 4 and 6 is largely reduced.

In the dynamic D-type flip-flop circuit 10 of Example 1, the inverters 4 and 6 as well as the transfer gates 3 and 5 include DTMOS transistors. Therefore, even when a low power source voltage is used for driving the dynamic D-type flip-flop circuit of Example 1, the driving ability is high and the operation speed is fast.

When the DTMOS transistor included in the transfer gate has the same threshold voltage as that of the DTMOS transistor included in the inverter, power consumption of the inverter is further increased than when the inverter is composed of general MOS transistors. Therefore, when power consumption is more important than speed, the general MOS transistor is more preferable to be used for constructing the inverter than the DTMOS transistor.

Figure 6:
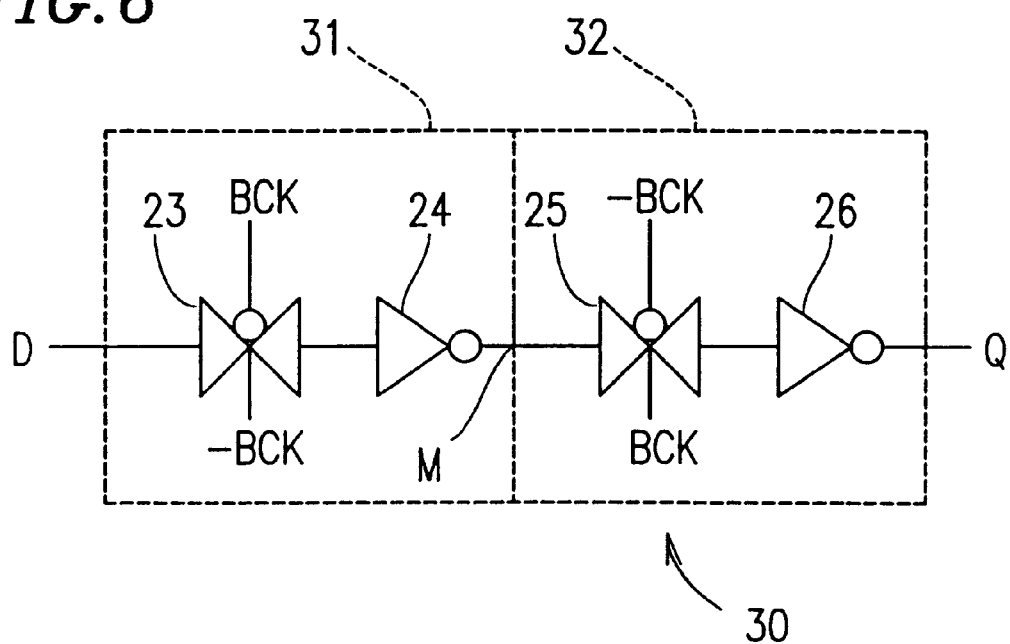
FIG. 6 is a diagram illustrating a conventional dynamic flip-flop circuit.
Figure 7:
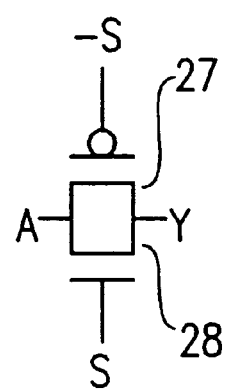
FIG. 7 is a diagram illustrating a configuration of transfer gates shown in FIG. 6.
Figure 8:
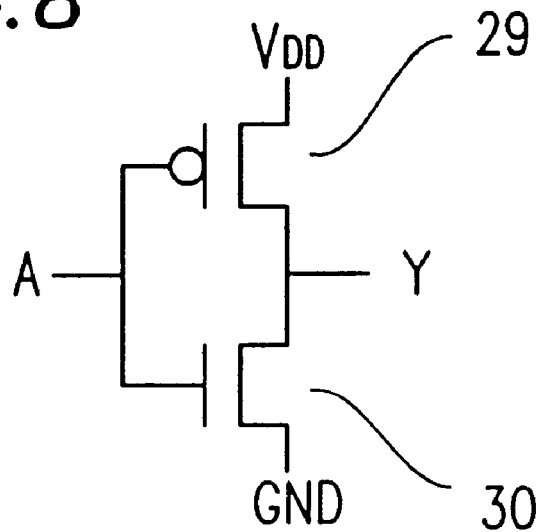
FIG. 8 is a diagram illustrating a configuration of inverters shown FIG. 6.
Figure 9:
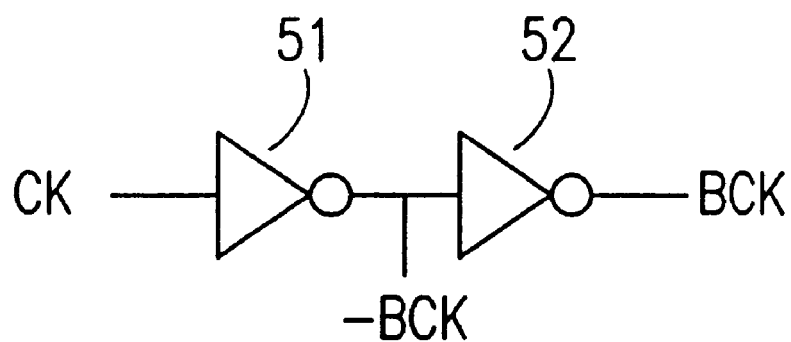
FIG. 9 is a diagram illustrating a circuit for generating clock signals BCK and –BCK.

The number of transistors necessary for the conventional flip-flop circuit including the dynamic flip-flop circuit 30 (FIG. 6) and a clock generating circuit shown in FIG. 9 is twelve, but six for the dynamic D-type flip-flop circuit 10 of Example 1. Thus, the use of the dynamic D-type flip-flop circuit of Example 1 can largely reduce the number of transistors as compared with the conventional flip-flop circuit.

The number of transistors for generating input signals relating to a clock signal and transistors for receiving the input signals is eight for the conventional flip-flop circuit, but two for the dynamic D-type flip-flop circuit 10 of Example 1. Thus, the use of the dynamic D-type flip-flop circuit can largely reduce power consumption caused by transferring the clock signal as compared with the conventional flip-flop circuit.

The number of elements of the conventional dynamic flip-flop circuit 30 can be reduced by omitting the P-MOS transistor 27 from the transfer gate 25. However, this may pose the following problem.

When the N-MOS transistor 28 which is used as the transfer gate 25 outputs a signal having the H level, the level of the signal decreases from the power source voltage $V_{DD}$ by a threshold voltage $V_{thn}$ of the N-MOS transistor 28.

When $|V_{thn}| \geq |V_{thp}|$ is satisfied where $V_{thp}$ is a threshold voltage of a P-MOS transistor of the inverter 26 positioned in a stage following the transfer gate 25, the P-MOS transistor is in the open state. This results in a direct current path from the power source to the ground, so that a current passes across the inverter 26.

When the threshold voltage $V_{thn}$ of the N-MOS transistor 28 as the transfer gate 25 is low, a leak current occurs therein, thereby making it impossible to hold a signal output from the N-MOS transistor 28.

In a similar manner, the number of elements of the conventional dynamic flip-flop circuit 30 can be reduced by omitting the N-MOS transistor 28 from the transfer gate 23. However, this may pose the following problem.

When the P-MOS transistor 27 which is used as the transfer gate 23 outputs a signal having the L level, the level of the signal increases from the ground voltage by the absolute value $|V_{thp}|$ of the threshold voltage of the P-MOS transistor 27. When $|V_{thp}| \geq |V_{thn}|$ is satisfied where $V_{thn}$ is a threshold voltage of the N-MOS transistor of the inverter 24, the N-MOS transistor positioned in a stage following the transfer gate is not in the fully closed state. This results in a current passing across the inverter 24.

When the threshold voltage Vthp of the P-MOS transistor 27 as the transfer gate 23 is low, a leak current occurs therein, thereby making it impossible to hold a signal output from the P-MOS transistor 27.

EXAMPLE 2

A static D-type flip-flop circuit according to Example 2 of the present invention will be described below with reference to FIG. 5.

Figure 5:
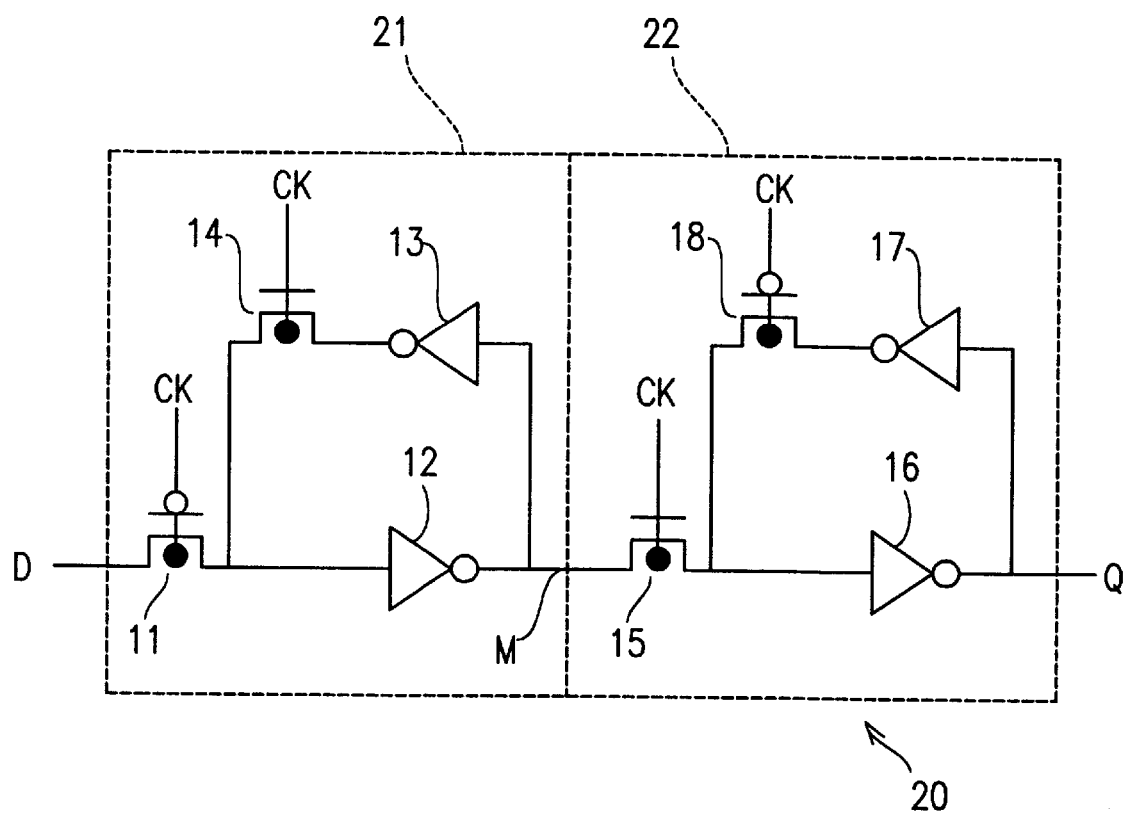
FIG. 5 is a diagram illustrating a static flip-flop circuit according to Example 2 of the present invention.

FIG. 5 illustrates the static D-type flip-flop circuit 20 of Example 2.

The static D-type flip-flop circuit 20 includes a master latch 21 and a slave latch 22. The master latch 21 includes a P-DTMOS transistor 11 and an N-DTMOS transistor 14, and inverters 12 and 13. The slave latch 22 includes an N-DTMOS transistor 15 and a P-DTMOS transistor 18, and inverters 16 and 17.

The P-DTMOS transistor 11 and the N-DTMOS transistor 14 each receive a clock signal CK at the gates thereof. The P-DTMOS transistor 11 receives an input data signal D, and outputs the received signal to the inverter 12 in accordance with the clock signal CK. The inverter 12 inverts the receive signal and outputs an inverse signal M.

The N-DTMOS transistor 15 and the P-DTMOS transistor 18 each receive the clock signal CK at the gates thereof. The N-DTMOS transistor 15 receives the signal M and outputs the received signal to the inverter 16 in accordance with the clock signal CK. The inverter 16 inverts the received signal and outputs an inverse signal as an output data signal Q.

In Example 2, the inverters 12, 13, 16, and 17 may include an N-DTMOS transistor and a P-DTMOS transistor shown in FIG. 4B. In this case, the static D-type flip-flop circuit 20 satisfies the following conditions.

The master latch 21 satisfies $|V_{thpon}|$ (a threshold voltage of the P-DTMOS transistor 11 in the open state) $|<|V_{thnoff}|$ (a threshold voltage of the N-DTMOS transistor of the inverter 12 in the closed state)$|$. The slave latch 22 satisfies $|V_{thnon}|$ (a threshold voltage of the N-DTMOS transistor 15 in the open state) $|<|V_{thpoff}|$ (a threshold voltage of the P-DTMOS transistor of the inverter 16 in the closed state)$|$.

This results in suppression of currents passing from the power source to ground across the inverter 12 and the inverter 16. Therefore, power consumption of the inverters 12 and 16 is largely reduced.

All the transistors included in the static D-type flip-flop circuit 20 of Example 2 maybe DTMOS transistors, thereby obtaining a static D-type flip-flop circuit which has a high degree of driving force and operates fast by a low power source voltage.

When the DTMOS transistor included in the transfer gate has the same threshold voltage as that of the DTMOS transistor included in the inverter, power consumption of the inverter is further increased than when the inverter is composed of general MOS transistors. Therefore, when power consumption is more important than speed, the general MOS transistor is more preferable to be used for constructing the inverter than the DTMOS transistor.

Furthermore, in Example 2, the N-DTMOS transistor 14 and the P-DTMOS transistor 18 are used as the transfer gates included in feedback circuits for enhancing the reliability of a signal. Therefore, the static D-type flip-flop circuit 20 operates only using a clock signal having one phase and one polarity as does the dynamic D-typeflip-flop circuit 10 shown in FIG. 1.

Figure 10:
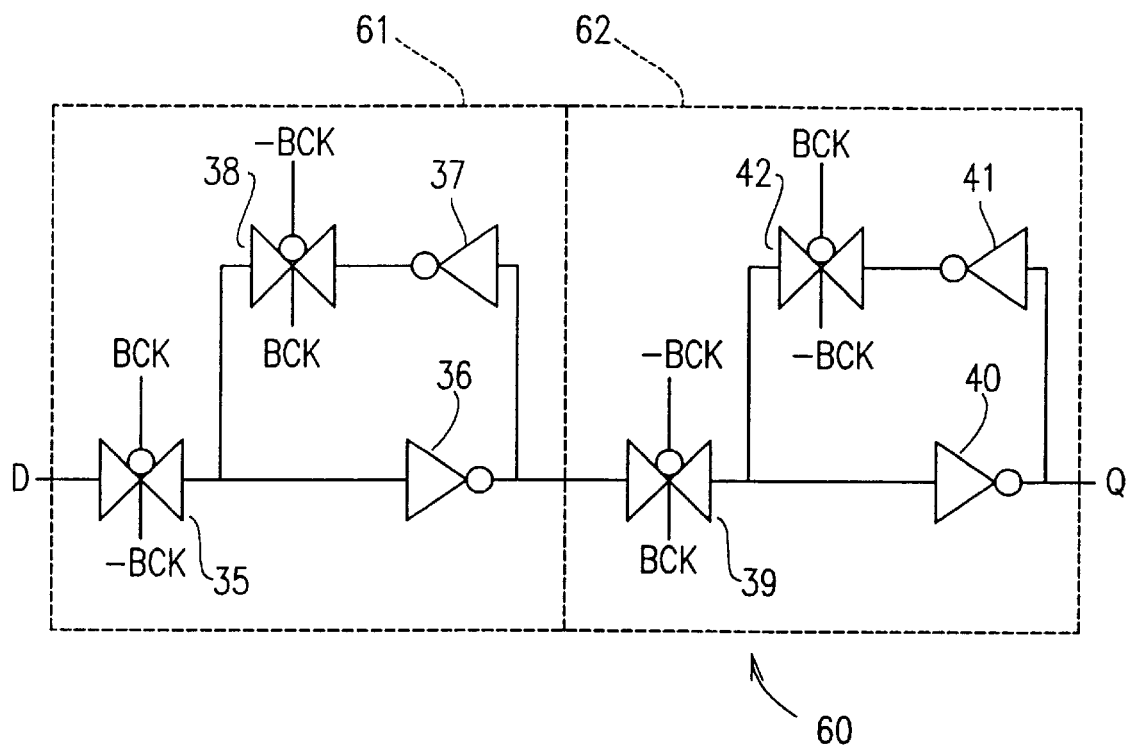
FIG. 10 is a diagram illustrating a configuration of a conventional static D-type flip-flop circuit.

The number of transistors necessary for the conventional flip-flop circuit including the static flip-flop circuit 60 (FIG. 10), and a clock generating circuit shown in FIG. 9 is twenty, but twelve for the static D-type flip-flop circuit 20 of Example 2. Thus, the use of the dynamic D-type flip-flop circuit of Example 2 can largely reduce the number of transistors as compared with the conventional flip-flop circuit.

The number of transistors for generating input signals relating to a clock signal and transistors for receiving the input signals is twelve for the conventional flip-flop circuit, but four for the static D-type flip-flop circuit 20 of Example 2. Thus, the static D-type flip-flop circuit 20 can largely reduce power consumption caused by transferring the clock signal as compared with the conventional flip-flop circuit.

The present invention is not limited to a flip-flop circuit. For example, at least one of the master latch 1, the slave latch 2, the master latch 21, and the slave latch 22 may be used as a single independent latch circuit.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A latch circuit, comprising:
a first circuit including an N-MOS transistor having a first electrode receiving a signal, a second electrode outputting the signal, a gate electrode, and a P-well; and a first inverter including input and output terminals,
wherein:
the second electrode of the N-MOS transistor is electrically connected to the input terminal of the first inverter;
the gate electrode of the N-MOS transistor is electrically connected to the P-well of the N-MOS transistor, the P-well being connected to a first potential;
the first inverter includes a P-MOS transistor having an N-well and a gate electrode electrically connected to each other, the N-well being connected to a second potential; and
the first potential is different from the second potential.

2. A latch circuit, comprising:
a first circuit including a P-MOS transistor having a first electrode receiving a signal, a second electrode outputting the signal, a gate electrode, and an N-well; and a first inverter including input and output terminals,
wherein:
the second electrode of the P-MOS transistor is electrically connected to the input terminal of the first inverter;
the gate electrode of the P-MOS transistor is electrically connected to the N-well of the P-MOS transistor, the N-well being connected to a first potential;
the first inverter includes an N-MOS transistor having a P-well and a gate electrode electrically connected to each other, the P-well being connected to a second potential; and
the first potential is different from the second potential.

3. A latch circuit according to claim 1, further comprising:
a second circuit including a P-MOS transistor having a first electrode receiving a signal, a second electrode outputting the signal, a gate electrode, and an N-well; and a second inverter including input and output terminals, wherein:

the second electrode of the P-MOS transistor is electrically connected to the input terminal of the second inverter;

the gate electrode of the P-MOS transistor is electrically connected to the N-well of the P-MOS transistor, the N-well being connected to a first Potential;

the second inverter includes an N-MOS transistor having a P-well and a gate electrode electrically connected to each other, the P-well being connected to a second potential; and the first potential is different from the second potential.

4. A latch circuit according to claim 3, wherein the first circuit serves as a master latch and the second circuit serves as a slave latch;

a clock signal having a first or second level is input to the first and second circuits;

the first circuit is in the open state when receiving the clock signal having the first level;

the first circuit is in the closed state when receiving the clock signal having the second level;

the second circuit is in the closed state when receiving the clock signal having the first level; and the second circuit is in the open state when receiving the clock signal having the second level.

5. A latch circuit according to claim 3, wherein the first circuit serves as a slave latch and the second circuit serves as a master latch:

a clock signal having a first or second level is input to the first and second circuits;

the first circuit is in the open state when receiving the clock signal having the first level;

the first circuit is in the closed state when receiving the clock signal having the second level;

the second circuit is in the closed state when receiving the clock signal having the first level; and the second circuit is in the open state when receiving the clock signal having the second level.

6. A latch circuit according to claim 1, wherein the first inverter further includes an N-MOS transistor having a P-well and a gate electrode electrically connected to each other, the P-well being connected to a first potential.

7. A latch circuit according to claim 3, wherein the second inverter further includes a P-MOS transistor having an N-well and a gate electrode electrically connected to each other, the N-well being connected to a first potential.

8. A latch circuit according to claim 6, wherein the absolute value of a threshold voltage of the N-MOS transistor included in the first circuit is smaller than the absolute value of a threshold voltage of the P-MOS transistor included in the first inverter.

9. A latch circuit according to claim 7, wherein the absolute value of a threshold voltage of the P-MOS transistor included in the second circuit is smaller than the absolute value of a threshold voltage of the N-MOS transistor included in the second inverter.

10. A latch circuit according to claim 4, wherein the clock signal has one phase and one polarity.

11. A latch circuit according to claim 5, wherein the clock signal has one phase and one polarity.

12. A latch circuit according to claim 3, wherein the first inverter includes an N-MOS transistor having a P-well and a gate electrode, and a P-MOS transistor having an N-well and a gate electrode.

13. A latch circuit according to claim 1, wherein the first potential is a ground potential and the second potential is a positive potential.

14. A latch circuit according to claim 2, wherein the first potential is a ground potential and the second potential is a positive potential.

15. A latch circuit according to claim 3, wherein the first potential is a ground potential and the second potential is a positive potential.

16. A latch circuit according to claim 6, wherein the first potential is a ground potential and the second potential is a positive potential.

17. A latch circuit according to claim 7, wherein the first potential is a ground potential and the second potential is a positive potential.

* * * * *